(12) United States Patent
Zambrano

(10) Patent No.: US 6,511,874 B2
(45) Date of Patent: Jan. 28, 2003

(54) INTEGRATED CIRCUIT STRUCTURE COMPRISING CAPACITOR ELEMENT AND CORRESPONDING MANUFACTURING PROCESS

(75) Inventor: Raffaele Zambrano, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/912,638

(22) Filed: Jul. 24, 2001

(65) Prior Publication Data

US 2001/0046735 A1 Nov. 29, 2001

Related U.S. Application Data

(62) Division of application No. 09/415,992, filed on Oct. 12, 1999, now Pat. No. 6,294,798.

(30) Foreign Application Priority Data

Oct. 12, 1998 (EP) ............................................. 98830597

(51) Int. Cl.$^7$ ...................... H01L 21/8242; H01L 71/20
(52) U.S. Cl. ...................... 438/239; 438/240; 438/253; 438/396
(58) Field of Search ............................... 438/240, 253, 438/396, 650, 652, 656, 680, 239; 257/306, 394, 506

(56) References Cited

U.S. PATENT DOCUMENTS

| | | | | |
|---|---|---|---|---|
| 5,110,752 A | * | 5/1992 | Lu | 257/309 |
| 5,173,437 A | * | 12/1992 | Chi | 438/253 |
| 5,270,243 A | * | 12/1993 | Tuan et al. | 438/241 |
| 5,326,714 A | * | 7/1994 | Liu et al. | 438/254 |
| 5,429,976 A | * | 7/1995 | Hong et al. | 438/253 |
| 5,554,557 A | * | 9/1996 | Koh | 438/396 |
| 5,644,151 A | | 7/1997 | Izumi et al. | 257/306 |
| 5,652,165 A | * | 7/1997 | Lu et al. | 438/396 |
| 5,668,039 A | * | 9/1997 | Lin | 438/387 |
| 5,716,875 A | | 2/1998 | Jones, Jr. et al. | 438/3 |
| 5,728,618 A | * | 3/1998 | Tseng | 438/253 |
| 5,773,314 A | | 6/1998 | Jiang et al. | 438/3 |
| 5,843,821 A | * | 12/1998 | Tseng | 438/253 |
| 6,037,206 A | * | 3/2000 | Huang et al. | 438/240 |
| 6,080,616 A | | 6/2000 | Kim | 438/239 |
| 6,300,655 B1 | * | 10/2001 | Ema et al. | 257/306 |
| 2001/0023950 A1 | * | 9/2001 | Kim | 257/295 |

FOREIGN PATENT DOCUMENTS

| | | |
|---|---|---|
| GB | 2318681 A | 4/1998 |
| WO | WO98/05071 | 2/1998 |

OTHER PUBLICATIONS

Wolf, Stanley "Silicon Processing For The VLSI Era vol. 1: Process Technology", Lattice Press, 1986, pp. 183–191.*

* cited by examiner

Primary Examiner—Michael S. Lebentritt
(74) Attorney, Agent, or Firm—Lisa K. Jorgenson; Robert Iannucci; Seed IP Law Group PLLC

(57) ABSTRACT

A circuit structure for semiconductor devices which are integrated on a semiconductor layer is provided. The structure comprises at least one MOS device and at least one capacitor element that has a bottom and a top electrode. The MOS device has conduction terminals formed in the semiconductor layer, as well as a control terminal covered with an overlying insulating layer of unreflowed oxide. The capacitor element is formed on the unreflowed oxide layer.

17 Claims, 1 Drawing Sheet

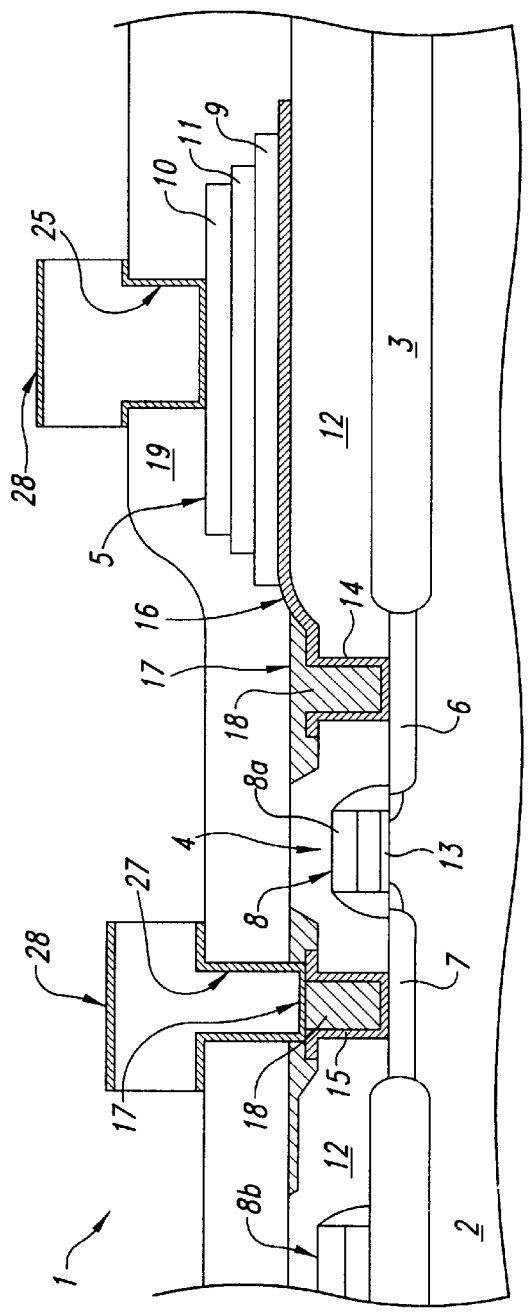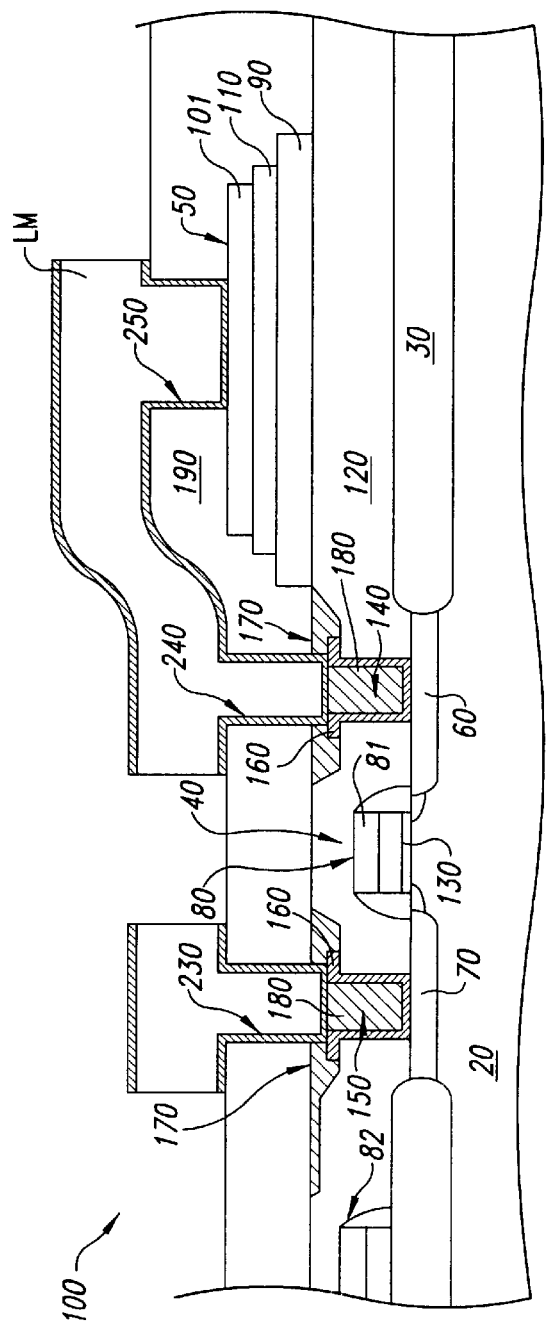

INTEGRATED CIRCUIT STRUCTURE COMPRISING CAPACITOR ELEMENT AND CORRESPONDING MANUFACTURING PROCESS

CROSS-REFERENCE TO RELATED APPLICATION

This application is a Divisional of pending U.S. patent application Ser. No. 09/415,992, filed Oct. 12, 1999 now U.S. Pat. No. 6,294,798.

TECHNICAL FIELD

This invention relates to an integrated circuit structure comprising a capacitor element, and corresponding manufacturing methods. Specifically, this invention relates particularly, but not exclusively, to a circuit structure which is easier to integrate than prior ones comprising CMOS or MOS devices and capacitor elements, such as ferroelectric devices.

BACKGROUND OF THE INVENTION

As is well known, ferroelectric devices, such as ferroelectric non-volatile memories, are acquiring growing importance in the field of integrate circuits, on account of their low consumption and high operational and switching speed compared to conventional non-volatile memories. In particular, special attention is being devoted to making such ferroelectric devices in combination with MOS devices integrated on a semiconductor substrate.

According to the prior art, these ferroelectric devices are formed after completing a CMOS structure to which they are subsequently connected, prior to forming the final metallization layers.

A known embodiment of these ferroelectric devices provides, after MOS devices, such as MOS transistors, etc., are formed in a semiconductor substrate, for an upper insulating layer to be formed over the entire chip surface. The ferroelectric device, e.g., a ferroelectric memory, is then formed which has a metal bottom electrode laid onto the upper insulating layer. A layer of a ferroelectric material covers the bottom electrode, and a metal upper electrode is laid onto the ferroelectric layer.

After isolating the ferroelectric device by means of another insulating layer, the electric connection between the upper electrode and conductive terminals of the MOS device is established.

According to the prior art, the ferroelectric device is formed on top of the insulating layer which covers MOS devices. This insulating layer may be a layer of doped oxide such as BPSG (Boron-Phosphorus-Silicon Glass).

While being advantageous in several ways, this solution has certain drawbacks tied to the thickness of the BPSG layer. In order to provide satisfactory planarization characteristics for the device surface, this thickness must be sufficiently large. It is also necessary to carry out thermal reflow cycles which may affect the characteristics of the device active regions. Forming openings for the device contacts in a fairly thick oxide layer such as this often poses objective difficulties from the fairly deep digging that must be performed therein.

SUMMARY OF THE INVENTION

Embodiments of this invention provide a circuit structure comprising both electronic devices formed with CMOS technology and capacitor elements, which have such structural and functional features to enable contact areas to be provided with a low aspect ratio (ratio of the contact depth to width), and a better integrated and more compact overall circuit structure, thereby overcoming the limitations and/or drawbacks of prior art circuit structures.

One of the concepts behind embodiments of this invention is to provide a circuit structure which comprises MOS devices integrated on a semiconductor substrate and covered with an unreflowed oxide layer, such as TEOS, and comprises capacitor elements formed above this oxide layer. The use of a TEOS layer for covering the MOS devices in the circuit structure of certain embodiments allows the thickness of the layer to be reduced wherein the openings are formed for the contacts used for connecting the MOS devices to the capacitor elements.

The features and advantages of a device according to the invention will be apparent from the following description of an embodiment thereof, given by way of nonlimitative example with reference to the accompanying drawings.

BRIEF DESCRIPTION OF THE DRAWINGS

FIG. 1 is a vertical cross-section of a portion of a semiconductor substrate wherein a first embodiment of a circuit structure is integrated in accordance with the invention.

FIG. 2 is a vertical cross-section of a portion of a semiconductor substrate wherein a second embodiment of a circuit structure is integrated in accordance with the invention.

DETAILED DESCRIPTION

Referring to the figures, generally shown at 1 is a circuit structure integrated on a semiconductor substrate 2 and comprising at least one device formed with CMOS technology 4 and connected to at least one capacitor element 5.

In the embodiment shown in FIG. 1, a thick oxide layer 3 is formed selectively onto the semiconductor substrate 2 of a first type of conductivity. The CMOS device 4, e.g., a MOS transistor, is formed in a portion of the substrate 2 which has no thick oxide 3 thereon.

As ones skilled in the art will recognize, the MOS transistor 4 has a source region 6 and a drain region 7 with a second type of conductivity; both regions being formed on the substrate 2 at a spacing from each other. These regions represent the conduction terminals of the transistor 4.

Advantageously, the source 6 and drain 7 regions could be formed by an LDD (Lightly Doped Drain) implantation technique.

A (control) gate electrode 8 of polysilicon overlies the source 6 and drain 7 regions and is isolated from the substrate by a thin oxide layer 13.

The gate electrode 8 may be overlaid conventionally by a conductive material layer 8a, such as silicide, and oxide spacers may be provided at the sides of the electrode 8 for lateral protection.

By the same process steps as are used to form the gate electrode 8, connection lines 8b of polysilicon are formed which run across the thick oxide 3. The connection lines 8b may be overlaid conventionally by a silicide layer.

The transistor 4 and interconnection lines 8b are then covered with an overlying oxide layer 12. This overlying oxide layer 12 is, according to an embodiment of the invention, an unreflowed oxide, e.g., tetraethylorthosilane (TEOS). Advantageously, this overlying oxide layer 12 may be a conformal oxide layer.

After depositing the TEOS layer 12, openings 14 and 15 are formed above and adjacent to the source 6 and drain 7 regions, and contacts 17 are provided within the openings.

In a specially advantageous embodiment, these contacts 17 may be produced by forming a layer of a conducting material 16, which is formed or deposited over predetermined exposed areas of the circuit structure 1 to coat the side walls and bottoms and upper edges of the openings 14 and 15, and cover at least in part a portion of the insulating layer 12 located at the entrances of said openings.

The layer of conductive material 16 and the source region 6 is also formed over the portion of the insulating layer 12 where the capacitor element 5 is to be formed, for the purpose of establishing the electrical connection between the source region 6 and the capacitor element 5.

In some embodiments, this layer of conducting material 16 is either titanium or titanium nitride, or may comprise a first layer of titanium and a second layer of titanium nitride.

An insulating fill layer 18 is then deposited inside the openings 14, 15. This insulating fill layer 18 may be TEOS.

The deposition of this layer 18 is followed by a planarizing process. Advantageously compared to the prior art, a chemical mechanical planarization process can be used here, such as a CMP (Chemical Mechanical Polishing) process and thermal reflowing processes are no longer needed.

According to a preferred embodiment of the invention, the minimum thickness for the residual oxide layer 12 is the thickness needed to cover the interconnection lines 8b that have been formed on the thick oxide 3.

A capacitor element 5 is formed on this residual oxide layer 12 and comprises a metal bottom electrode 9, e.g., of platinum.

An intermediate layer 11 covers the bottom electrode 9, and a metal top electrode 10, e.g., also of platinum, is laid onto said intermediate layer 11. This intermediate layer 11 may be an oxide layer.

In a specially advantageous embodiment, the capacitor element 5 is a ferroelectric memory, and the intermediate layer 11 is a layer of a ferroelectric material. This ferroelectric material may be PZT (PbZr$_{1-x}$, Ti$_x$O$_3$), which has a perovskite structure, or SBT (SrBi$_2$Ta$_2$O$_9$), a which has layered perovskite structure.

Another oxide layer 19, preferably of TEOS, is deposited to isolate the capacitor element 5.

Openings 27 and 25 are defined in this oxide layer 19, respectively above and adjacent to the contact 17 of the drain region 7 and the top electrode 10 of the capacitor element 5.

Finally, a metallization layer 28 functions to connect these regions electrically.

Referring to FIG. 2, generally shown at 100 is a second embodiment of a circuit structure integrated on a semiconductor substrate 20 and comprising at least one device formed with CMOS technology 40 and connected to at least one capacitor element 50.

In the embodiment shown in FIG. 2, a thick oxide layer 30 is formed selectively over the semiconductor substrate 20 of a first type of conductivity. The CMOS device 40, e.g., a MOS transistor, is formed in a portion of the substrate 20 not covered by the thick oxide 30.

The MOS transistor 40 comprises a source region 60 and a drain region 70 with a second type of conductivity, both regions being formed on the substrate 20 at a spacing from each other. These regions represent the conduction terminals of the transistor 40. Advantageously, the source 60 and drain 70 regions can be formed using an LDD (Lightly Doped Drain) implantation technique.

A (control) gate electrode 80 of polysilicon overlies the source 60 and drain 70 regions and is isolated from the substrate by a thin oxide layer 130.

The gate electrode 80 may be overlaid conventionally by a conductive material layer 81, such as silicide, and oxide spacers may be provided at the electrode 80 sides for lateral protection.

With the same process steps as are used to form the gate electrode 80, connection lines 82 of polysilicon are also formed which run across the thick oxide 30. The connection lines 82 may be overlaid conventionally by a silicide layer.

The transistor 40 and interconnection lines 82 are then covered with an overlying oxide layer 120. This overlying oxide layer 120 is, according to the invention, an unreflowed oxide, e.g., tetraethylorthosilane (TEOS).

Openings 140 and 150 are formed in the layer 120 above and adjacent to the source 60 and drain 70 regions for forming contacts 170.

In a specially advantageous embodiment, these contacts 170 may be provided by forming a layer of a conducting material 160, which is deposited over the side walls and bottoms and upper edges of the openings 140 and 150, and covers at least in part a portion of the upper insulating layer 120 around said openings. Advantageously, this layer of conductive material 160 may be either titanium or titanium nitride, or may comprise a first layer of titanium and a second layer of titanium nitride.

An insulating fill layer 180 is then deposited selectively inside the openings 140, 150.

Here again, in a preferred embodiment the minimum thickness for the residual oxide layer 120 is the thickness needed to adequately cover the interconnection lines 82 that have been formed on the thick oxide 30.

A capacitor element 50 is formed on this residual oxide layer 120 and has a metal bottom electrode 90, e.g., of platinum.

An intermediate layer 110 covers the bottom electrode 90, and a metal top electrode 101, e.g., also of platinum, is laid onto said intermediate layer 110. This intermediate layer 110 may be, for example, an oxide layer.

In a specially advantageous embodiment, the capacitor element 50 is a ferroelectric memory, and the intermediate layer 110 is a layer of a ferroelectric material.

This ferroelectric material may be PZT (PbZr$_{1-x}$, Ti$_x$O$_3$), which has a perovskite structure, or SBT (SrBi$_2$Ta$_2$O$_9$), a which has layered perovskite structure Another oxide layer 190, preferably of TEOS, is deposited to isolate the capacitor element 50.

Openings 230, 240 and 250 are defined in this oxide layer 190, respectively above and adjacent to the contacts 170 of the drain 70 and source 60 regions and the top electrode 101 of the capacitor element 50. A metal line LM is then constructed that enters the openings.

In this embodiment, the connection between the MOS device 40 and the capacitor element 50 is provided by the metal line LM.

In either of the above embodiments, the contact regions are defined before the capacitor element is formed. This allows contacts with a low aspect ratio to be provided, which facilitates the etching and filling steps therefor, as well as the covering step for the conducting material layer which is deposited after their definition.

In addition, the lithography and etch steps are greatly simplified for providing the contacts between the source and drain regions of the transistor and the electrode of the capacitor element.

It is no longer necessary, as it used to be in the prior art, to define "high" contacts, or contacts on the electrodes of the capacitor element and on the polysilicon strips on the thick oxide concurrently with "low" contacts or contacts on the source and drain regions of the transistor.

In fact, the openings provided in the TEOS layer under the bottom electrode of the capacitor element, which are coated along their surface edges, walls, and bottoms with a conducting material layer, allow the contact depth to be limited at the source and drain regions of the transistor, compared to the prior art, with attendant benefits in terms of integration and workability.

While reference has been made in the foregoing description to "strapped" structures wherein the capacitor element is formed at the field oxide, all the advantages of the invention can also be secured for "stacked" structures wherein the capacitor element is formed at the source region of the MOS device.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing a circuit structure integrated on a semiconductor layer, comprising:
   selectively forming a thick oxide layer;
   forming a MOS device which has conduction terminals formed in the semiconductor layer and an overlying control terminal in a portion of the semiconductor layer not covered by the thick oxide layer;
   forming an unreflowed oxide layer;
   forming a contact opening in the unreflowed oxide layer and above one of the conduction terminals;
   lining walls of the contact opening with a conductive layer;
   filling the contact opening with an insulating fill material; and
   forming a capacitor element over the unreflowed oxide layer, the capacitor element including first and second electrodes and an insulating material between the electrodes, the insulating material being forming after the contact opening is filled with the insulating fill material and while the contact opening remains filled with the insulating fill material.

2. The manufacturing process according to claim 1 wherein said unreflowed oxide layer is conformal.

3. The manufacturing process according to claim 2 wherein said conformal oxide layer is TEOS.

4. The manufacturing process according to claim 1 wherein the contact opening is provided in the unreflowed oxide layer before forming the capacitor element.

5. The manufacturing process according to claim 4, further comprising performing a chemical-mechanical planarization on the insulating fill material prior to forming the capacitor element.

6. The manufacturing process according to claim 5, wherein lining the contact opening includes extending a portion of the conductive layer on top of the unreflowed oxide layer and the electrodes and insulating material of the capacitor element are formed directly on the portion of the conductive material extending on top of the unreflowed oxide layer.

7. The manufacturing process according to claim 1 wherein said capacitor element is a memory.

8. A method for forming an integrated circuit comprising:
   depositing a first oxide layer on a semiconductor substrate;
   depositing a second oxide layer on the semiconductor substrate,
   forming a gate region to an MOS transistor on the second oxide layer;
   forming first and second active regions of the MOS transistor in the semiconductor substrate;
   forming an insulating layer of unreflowed oxide on the semiconductor substrate;
   forming a capacitor on the unreflowed oxide; and
   coupling the capacitor to one of the active regions of the MOS transistor, wherein the active region couples to the capacitor by a metal line deposited directly on the unreflowed oxide.

9. A method for forming an integrated circuit comprising:
   depositing a first oxide layer on a semiconductor substrate;
   depositing a second oxide layer on the semiconductor substrate,
   forming a gate region to an MOS transistor on the second oxide layer;
   forming first and second active regions of the MOS transistor in the semiconductor substrate;
   forming an insulating layer of unreflowed oxide on the semiconductor substrate;
   forming a capacitor on the unreflowed oxide; and
   coupling the capacitor to one of the active regions of the MOS transistor, wherein coupling the capacitor to one of the active regions comprises:
   forming in the unreflowed oxide a first contact opening aligned with the one of the active regions of the MOS transistor that is to be contacted;
   lining surface edges, walls and a bottom of the contact opening with at least one conducting layer;
   depositing a third oxide layer over the capacitor and over the contact opening;
   forming a capacitor opening in the third oxide layer that is aligned with an electrode of the capacitor;
   forming a second contact opening in the third oxide layer that is aligned with the first contact opening; and
   forming a conductive metal line over the third oxide layer that couples the electrode of the capacitor with the contacted active region of the MOS transistor.

10. The method of claim 8 wherein the layer of unreflowed oxide is conformal.

11. The method of claim 8 wherein the layer of unreflowed oxide is TEOS.

12. The method of claim 8 wherein contact openings are provided in the layer of unreflowed oxide before forming the capacitor.

13. The method of claim 12, further comprising lining surface edges, walls, and bottoms of the contact openings with a conducting layer.

14. The method of claim 13, further comprising filling the contact openings with an insulating fill material.

15. The method of claim 14 wherein the insulating layer is a first insulating layer and forming the capacitor includes:
   forming a conductive bottom electrode;
   forming a conductive top electrode; and
   forming a second insulating layer between the top and bottom electrodes, the second insulating layer being formed after the contact openings are filled with the insulating fill material.

16. The method of claim 15 wherein the second insulating layer is ferroelectric.

17. The method of claim 15, further comprising:
   performing a chemical-mechanical planarization of the insulating fill material after filling the contact openings and before forming the second insulating layer of the capacitor.

* * * * *